(12) United States Patent
McRae

(10) Patent No.: US 10,718,478 B2
(45) Date of Patent: Jul. 21, 2020

(54) APPARATUS AND METHOD FOR HARVESTING ENERGY FOR A LIGHT

(71) Applicant: National Tree Company, Cranford, NJ (US)

(72) Inventor: Michael M. McRae, Ormond Beach, FL (US)

(73) Assignee: National Chirstmas Products LLC, Cranford, NJ (US)

( * ) Notice: Subject to any disclaimer, the term of this patent is extended or adjusted under 35 U.S.C. 154(b) by 0 days.

(21) Appl. No.: 16/418,517

(22) Filed: May 21, 2019

(65) Prior Publication Data
US 2019/0390829 A1 Dec. 26, 2019

Related U.S. Application Data

(60) Provisional application No. 62/688,954, filed on Jun. 22, 2018.

(51) Int. Cl.
*F21S 9/02* (2006.01)
*F21V 23/02* (2006.01)
(Continued)

(52) U.S. Cl.
CPC ............. *F21S 9/02* (2013.01); *F21V 23/003* (2013.01); *F21V 23/023* (2013.01); *H02J 50/10* (2016.02);
(Continued)

(58) Field of Classification Search
CPC ........ F21S 10/046; F21S 10/04; F21S 10/043; F21S 9/02; F21S 6/001; H01F 7/064; H05B 37/0281; H05B 33/0815; H05B 33/0845; H05B 33/0857; H05B 33/0812; F21V 9/30; F21V 23/04; F21V 23/0407; F21V 23/001; F21V 23/009; F21V 15/01; F21V 23/003; F21V 21/088; F21K 9/00; F21Y 2101/00; F21Y 2115/10; Y02B 20/42; Y10T 29/4902; Y10T 29/49002; Y10S 362/81; F21W 2121/00; F21W 2121/06;
(Continued)

(56) References Cited

U.S. PATENT DOCUMENTS

2007/0223217 A1 * 9/2007 Hsu ........................... F21S 9/02 362/183
2010/0124050 A1 * 5/2010 Hau ........................ H05B 45/10 362/183
(Continued)

FOREIGN PATENT DOCUMENTS

CN 204424289 U * 6/2015 ............. Y02E 10/50
CN 108199039 A * 6/2018
(Continued)

*Primary Examiner* — Isiaka O Akanbi
*Assistant Examiner* — Fatima N Farokhrooz
(74) *Attorney, Agent, or Firm* — Ellenoff Grossman & Schole LLP; James M. Smedley; Alex Korona

(57) ABSTRACT

An apparatus is disclosed. The apparatus has a lighting component, an energy storage assembly electrically connected to the lighting component, a control assembly electrically connected to the energy storage assembly, and an energy receiving component electrically connected to the control assembly. The energy receiving component wirelessly receives energy. The energy storage assembly includes a Graphene strip.

13 Claims, 15 Drawing Sheets

(51) Int. Cl.
*F21V 23/00* (2015.01)
*H02J 50/27* (2016.01)
*H02J 50/10* (2016.01)
C23C 14/06 (2006.01)
F21W 121/00 (2006.01)
F21Y 115/10 (2016.01)

(52) U.S. Cl.
CPC .......... *H02J 50/27* (2016.02); *C23C 14/0605* (2013.01); *F21W 2121/00* (2013.01); *F21Y 2115/10* (2016.08)

(58) Field of Classification Search
CPC ...... F21W 2121/04; H02J 50/20; H02J 50/10; H02J 7/025; H01L 33/62; H01M 4/133; H01K 7/06
See application file for complete search history.

(56) References Cited

U.S. PATENT DOCUMENTS

| | | | | |
|---|---|---|---|---|
| 2011/0133655 A1* | 6/2011 | Recker | ................... | H05B 47/16 315/159 |
| 2013/0119349 A1* | 5/2013 | Chung | ................ | H01L 21/8232 257/29 |
| 2014/0184172 A1* | 7/2014 | Momo | ................... | H01M 10/44 320/160 |
| 2014/0315091 A1* | 10/2014 | Yamazaki | ........... | H01M 4/0426 429/231.8 |
| 2015/0092972 A1* | 4/2015 | Lai | ....................... | H04R 1/1008 381/333 |
| 2015/0228859 A1* | 8/2015 | Morreale | ............ | H01L 51/5296 257/29 |
| 2015/0276204 A1* | 10/2015 | Ray | ........................ | F21S 6/001 239/20 |
| 2017/0256817 A1* | 9/2017 | Kadoma | ........... | H01M 10/0525 |
| 2018/0283633 A1* | 10/2018 | Roberts | ..................... | F21S 9/02 |
| 2019/0044392 A1* | 2/2019 | Chowdhury | ............ | H02J 50/80 |

FOREIGN PATENT DOCUMENTS

| | | | | |
|---|---|---|---|---|
| CN | 108232076 A | * | 6/2018 | |
| DE | 202011106480 U1 | * | 11/2011 | ............. F21V 2/003 |
| DE | 202013101955 | * | 7/2013 | .............. F21S 10/04 |

* cited by examiner

US 10,718,478 B2

APPARATUS AND METHOD FOR HARVESTING ENERGY FOR A LIGHT

CROSS-REFERENCE TO RELATED APPLICATIONS

This application claims the benefit of the following provisional application, which is hereby incorporated by reference in its entirety: 62/688,954 filed Jun. 22, 2018, the entire disclosure of which is incorporated herein by reference.

TECHNICAL FIELD

The present disclosure generally relates to an apparatus and method for harvesting energy, and more particularly to an apparatus and method for harvesting energy for a light.

BACKGROUND

Artificial illumination includes light that is not natural light. Artificial light may be a product of human creative activity. Some artificial light may be employed for decoration, safety, or convenience. In some scenarios, decorative light displays may involve illumination of many lights.

Users of illuminated artificial lights include individuals and organizations. Some decorative artificial lights may be utilized during holidays or special occasions. Some holiday seasons may last weeks or months. A decorative artificial light display may thereby remain illuminated for an extended period of time.

Illuminating artificial lights involves an energy source. Some artificial lights may be powered with various electrical energy sources. In some scenarios, artificial lights may be powered with electrical energy from, for example, a battery or an electrical distribution grid. However, sustained illumination of some battery-powered artificial lights may involve costly battery replacement or inconvenient battery recharging. Also, some illuminated artificial lights powered from an electrical distribution grid may involve cumbersome power cord connection.

The exemplary disclosed apparatus and method are directed to overcoming one or more of the shortcomings set forth above and/or other deficiencies in existing technology.

SUMMARY OF THE DISCLOSURE

In one exemplary aspect, the present disclosure is directed to an apparatus. The apparatus includes a lighting component, an energy storage assembly electrically connected to the lighting component, a control assembly electrically connected to the energy storage assembly, and an energy receiving component electrically connected to the control assembly. The energy receiving component wirelessly receives energy. The energy storage assembly includes a Graphene strip.

In another aspect, the present disclosure is directed to a method. The method includes providing a multicompartment assembly including a first deposition vacuum chamber, a first cooling vacuum chamber, a second deposition vacuum chamber, and a second cooling vacuum chamber, passing a belt through the first deposition vacuum chamber, the first cooling vacuum chamber, the second deposition vacuum chamber, and the second cooling vacuum chamber, and depositing Graphene on the belt as the belt passes through the first deposition vacuum chamber. The method also includes cooling the deposited Graphene on the belt as the belt passes through the first cooling vacuum chamber, depositing insulation material on the cooled deposited Graphene on the belt as the belt passes through the second deposition chamber, and cooling the deposited insulation material on the cooled deposited Graphene on the belt as the belt passes through the second cooling vacuum chamber.

DETAILED DESCRIPTION AND INDUSTRIAL APPLICABILITY

In at least some exemplary embodiments, the exemplary disclosed apparatus and method include configuring an LED with a power source including a battery, coupling the LED with an Energy Harvester adapted to capture ambient energy from Wi-Fi radiation (e.g., and/or radiofrequency electromagnetic radiation), storing Wi-Fi energy (e.g., and/or radiofrequency electromagnetic radiation energy) in the battery, and powering the LED from the Wi-Fi energy (e.g., and/or radiofrequency electromagnetic radiation energy) stored in the battery. In an illustrative example, the battery may be a rechargeable battery. The rechargeable battery may be, for example, a Graphene Capacitor/Battery (e.g., or any other suitable type of battery formed from any other suitable material such as material having similar properties as Graphene), permitting a battery with a reduced size to store adequate charge to power an LED for a useful time period. In at least some exemplary embodiments, the Graphene Capacitor/Battery may be constructed based on vacuum deposition of Graphene strips with intervening insulation strips. In some examples, the Energy Harvester may be tunable, permitting energy harvest from energy sources radiating at various frequencies. Various exemplary embodiments may power LEDs with harvested wireless energy, permitting illumination at reduced cost for extended time periods.

Figure 1A:
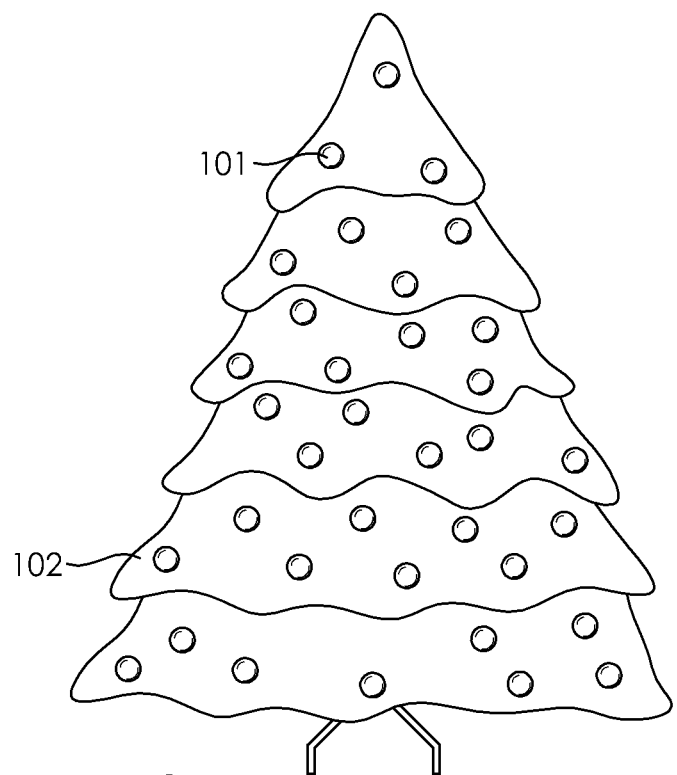
FIGS. 1A, 1B, 1C, and 1D depict exemplary embodiments of harvested energy powered light embodiment decorations configured with an LED having a power source including a battery coupled with an LED and an Energy Harvester adapted to capture ambient energy from Wi-Fi radiation (e.g., and/or radiofrequency electromagnetic radiation), to store Wi-Fi energy (e.g., and/or radiofrequency electromagnetic radiation energy) in the battery, and power the LED from the Wi-Fi energy (e.g., and/or radiofrequency electromagnetic radiation energy) stored in the battery.
Figure 1B:
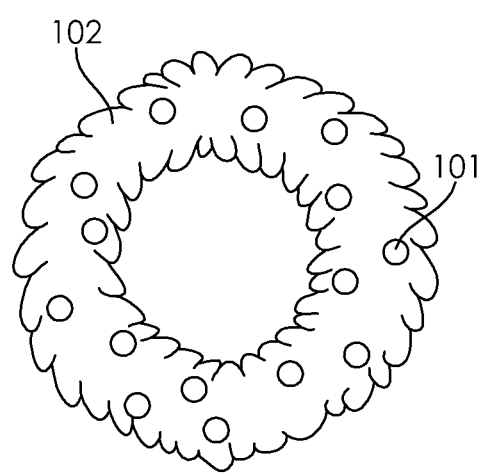
Figure 1D:
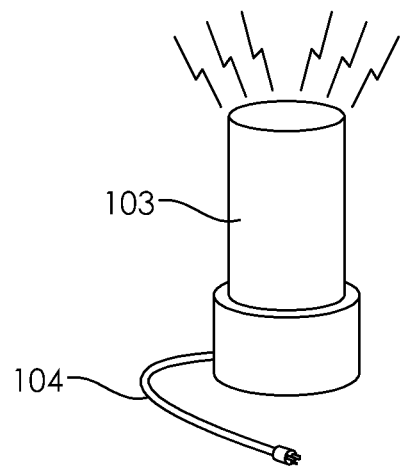
Figure 1C:
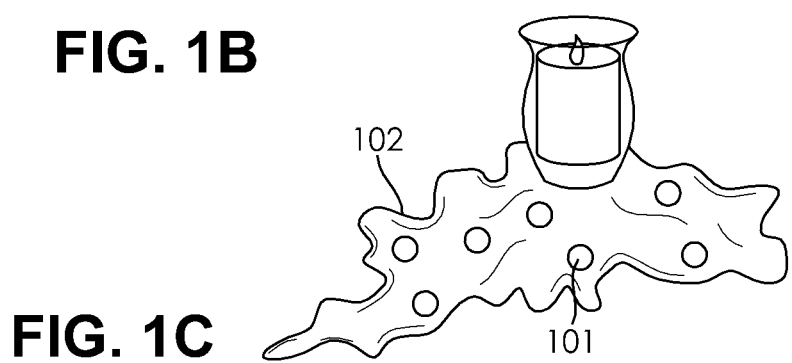

FIGS. 1A through 1D depict exemplary harvested energy powered light decorations configured with an LED having a power source including a battery coupled with an LED and an Energy Harvester adapted to capture ambient energy from Wi-Fi radiation (e.g., and/or radiofrequency electromagnetic radiation), store Wi-Fi energy (e.g., and/or radiofrequency electromagnetic radiation energy) in the battery, and power the LED from the Wi-Fi energy (e.g., and/or radiofrequency electromagnetic radiation energy) stored in the battery. FIGS. 1A, 1B, and 1C illustrate a group of exemplary decorations 102 with exemplary LED assemblies 101 (e.g., in place as determined by the user). FIG. 1D illustrates an exemplary wireless Wi-Fi/RF source of energy 103 having for example a power cord 104. Source of energy 103 may include a remote-control unit that sends signals for control to an LED assembly receiver.

Figure 2:
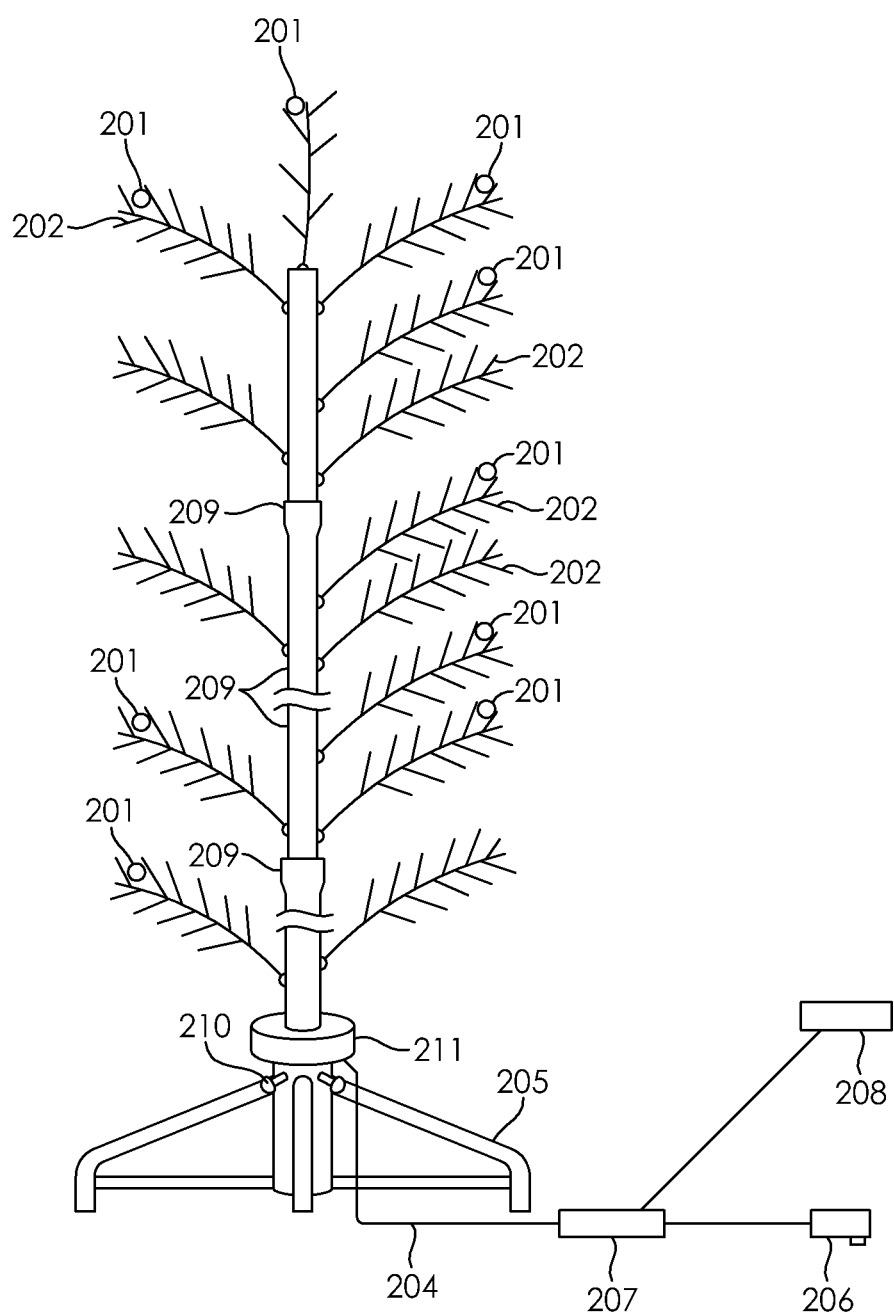
FIG. 2 depicts an exemplary harvested energy powered light embodiment decorative tree configured with an LED having a power source including a battery coupled with an LED and an Energy Harvester adapted to capture ambient energy from Wi-Fi radiation (e.g., and/or radiofrequency electromagnetic radiation), to store Wi-Fi energy (e.g., and/or radiofrequency electromagnetic radiation energy) in the battery, and power the LED from the Wi-Fi energy (e.g., and/or radiofrequency electromagnetic radiation energy) stored in the battery.

FIG. 2 illustrates an exemplary harvested energy powered light embodiment decorative tree configured with an LED having a power source including a battery coupled with an LED and an Energy Harvester adapted to capture ambient energy from Wi-Fi radiation (e.g., and/or radiofrequency electromagnetic radiation), store Wi-Fi energy (e.g., and/or radiofrequency electromagnetic radiation energy) in the battery, and power the LED from the Wi-Fi energy (e.g., and/or radiofrequency electromagnetic radiation energy) stored in the battery. FIG. 2 illustrates a group of exemplary decorations 202 with exemplary LED assemblies 201. For example, FIG. 2 illustrates an artificial decorative tree in which a tree stand 205 (e.g., having tree stand securing bolts 210) has a Wi-Fi or RF transmitter housing 211 (e.g., transmitter case) that receives its power via a wire cable 204 that is connected to a control 207 that receives power from a voltage adapter 206 that may plug into a household power socket. Control 207 may receive function signals from a remote-control unit 208. Transmitter housing 211 may contain a transmitter that transmits power wirelessly up the tree to LED light assemblies 201 mounted on decorations 202 (e.g., branches) of tree sections 209.

Figure 3:
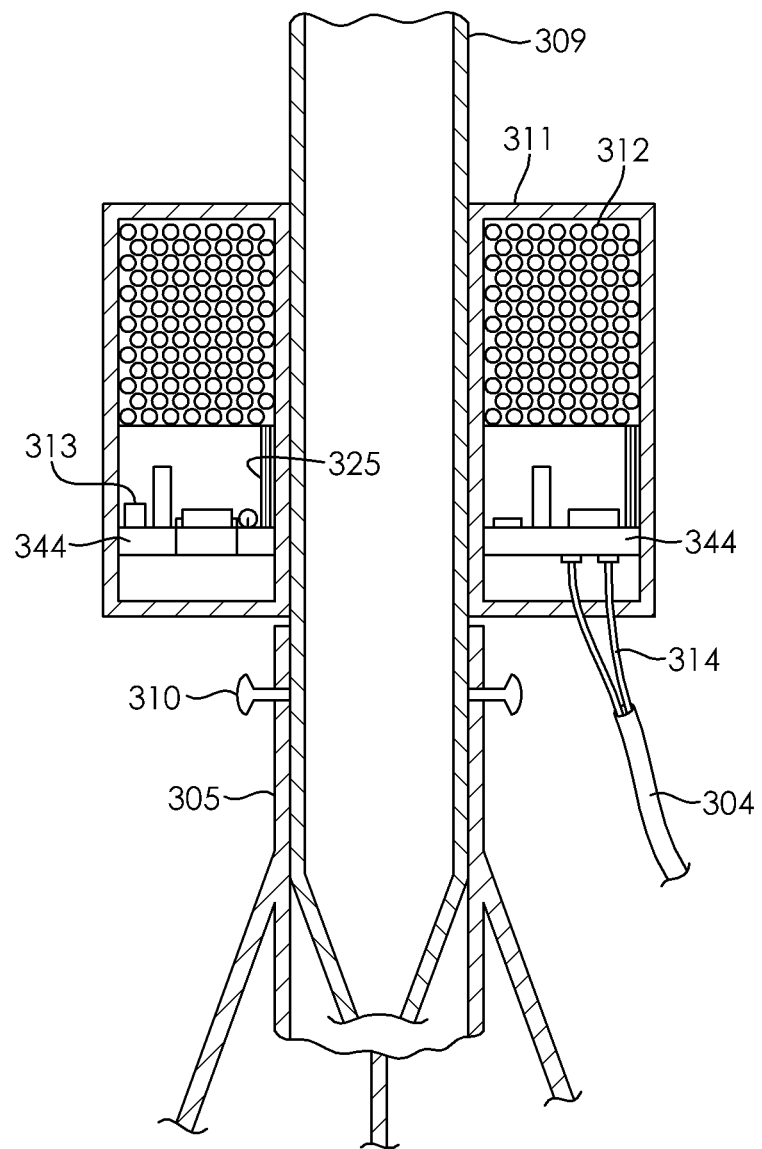
FIG. 3 depicts a cross section view of an exemplary transmitter case.

FIGS. 3-7 illustrate exemplary embodiments of LED assemblies powered via harvested energy stored in one or more energy storage devices (e.g., a Graphene battery). FIG. 3 illustrates a cross-sectional view of an exemplary transmitter case. FIG. 3 illustrates a cross section drawing for a transmitter case 311 that may house a transmitting coil 312, which may be connected by coil leads 325 to a circuit board 344. Transmitter case 311 may also include Wi-Fi or RF transmitting control components 313 and may receive power from power leads 314 housed in a power cord 304. In at least some exemplary embodiments, transmitter case 311 may be placed on a member (e.g., tree pole 309) above a tree stand 305 that may be secured by tree stand securing bolts 310.

Figure 4A:
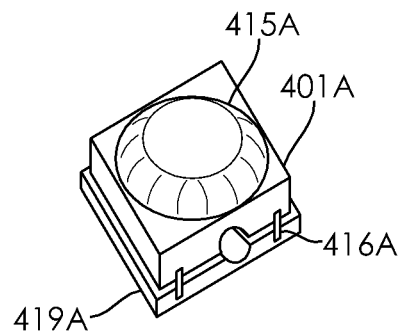
FIGS. 4A, 4B, and 4C depict various exemplary embodiments of illustrative LED assembly designs.
Figure 4B:
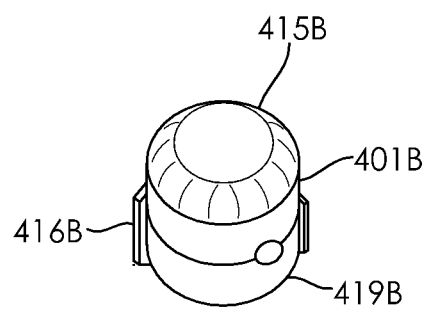
Figure 4C:
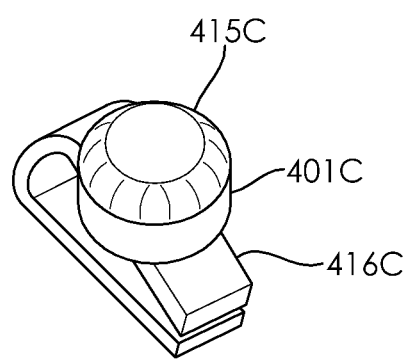

FIGS. 4A, 4B, and 4C illustrate various exemplary embodiments of LED assemblies. FIG. 4A illustrates an LED assembly 401A that may include an LED lens 415A, an LED base 419A, and a securing clip 416A. FIG. 4B illustrates an LED assembly 401B that may include an LED lens 415B, an LED base 419B, and a securing clip 416B. FIG. 4C illustrates an LED assembly 401C that may include an LED lens 415C and a securing clip 416C.

Figure 5:
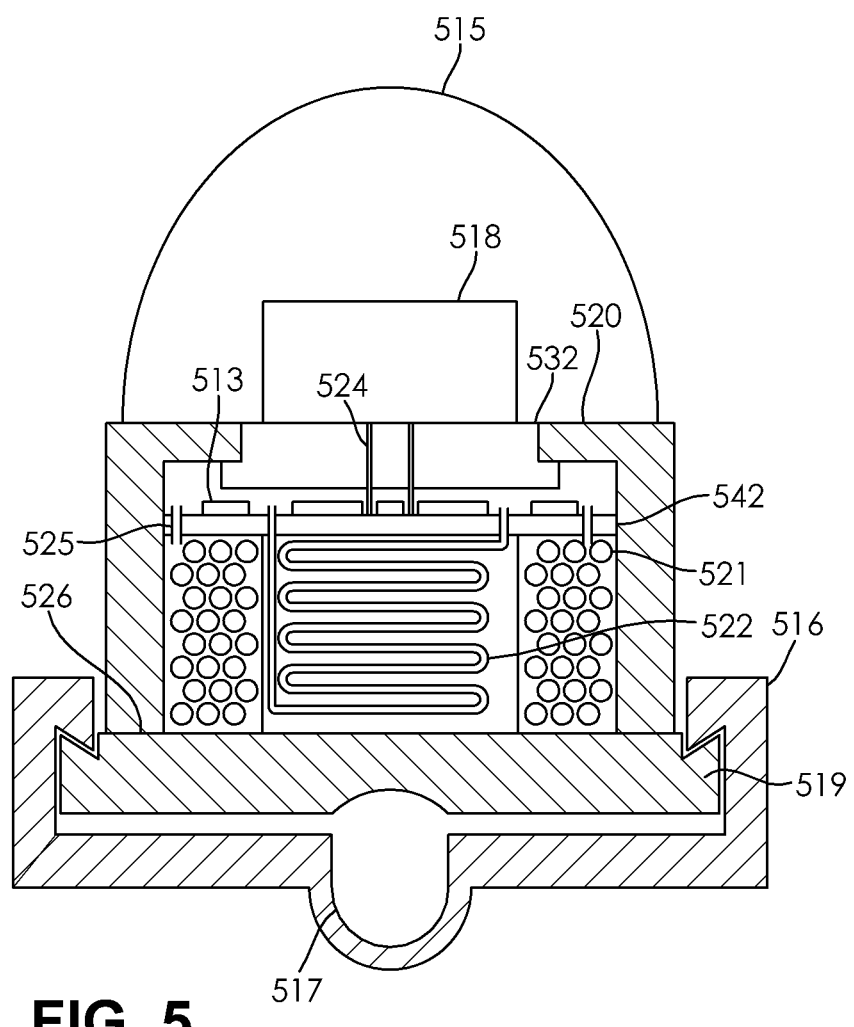
FIG. 5 depicts an illustrative a cross sectional view of an LED assembly with an LED lens covering the LED.

FIG. 5 illustrates a cross sectional view of an exemplary LED assembly having an LED lens covering an LED. In addition to being an LED assembly, the exemplary disclosed lighting assembly may be any desired lighting assembly such as, for example, an incandescent lighting assembly, a halogen lighting assembly, or any other desired type of lighting assembly. An LED lens 515 may cover an LED 518. Leads 524 may connect to LED 518 through an opening in a heat sink 532 on which LED 518 is mounted to a circuit board 542. Circuit board 542 may include frequency tuning, Wi-Fi receiver components, circuitry 513, and/or function controls. Circuit board 542 may be connected to a Graphene and cellulose insulator stack battery 522. Circuit board 542 may also be connected to a receiving coil 521 by leads 525. Receiving coil 521 may for example receive or collect energy transferred by a transmitting coil (e.g., transmitting coil 312) or any other suitable Wi-Fi or RF source. Components of circuit board 542 may harvest the energy collected by receiving coil 521, and this energy may be stored in stack battery 522, which may be used to power LED 518. Circuit board 542, receiving coil 521, and/or stack battery 522 may be electrically connected to facilitate transfer of energy to LED 518. Lens 515 may be mounted on a housing 520 that may be bonded to a base 519 by a bond 526 (e.g., bonding material) and a mounting clip 517 including a portion 516 that may receive the LED assembly.

Figure 6A:
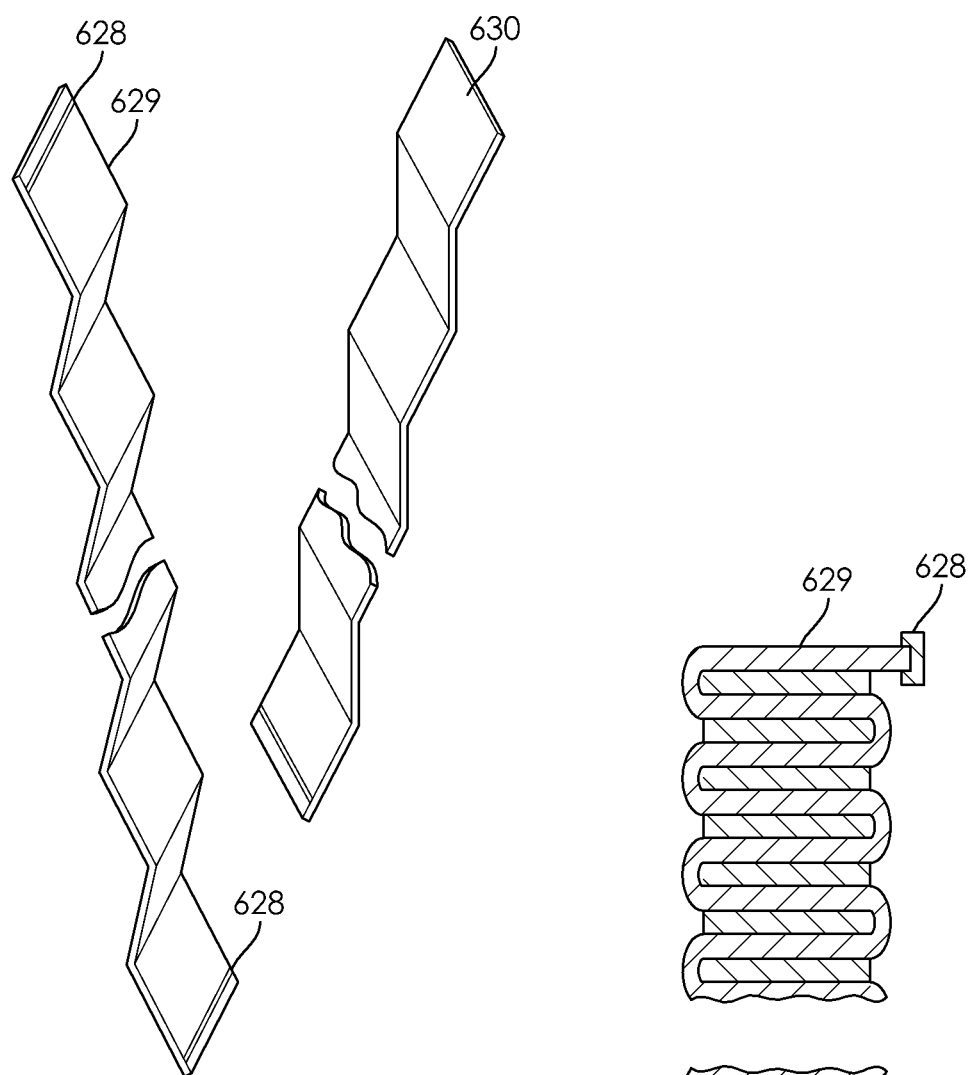
FIGS. 6A and 6B depict an illustrative stack assembly of an exemplary Graphene stack battery.
Figure 6B:
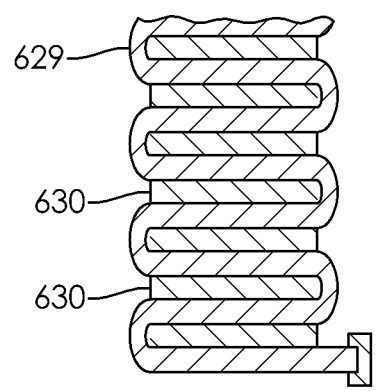

FIG. 6A illustrates an exemplary stack assembly of an exemplary Graphene stack battery. A Graphene stack battery 622 may be made by the assembly of a single atom Graphene strip 629 that may include a battery electrode (e.g., to a lead bonding area 628 that may be folded in layers with an insulator strip 630 such as a cellulose strip or any other suitable insulator material). FIG. 6B illustrates Graphene strip 629 and insulator strip 628 folded in a stack configuration with lead bonding area 628 at each end.

Figure 7:
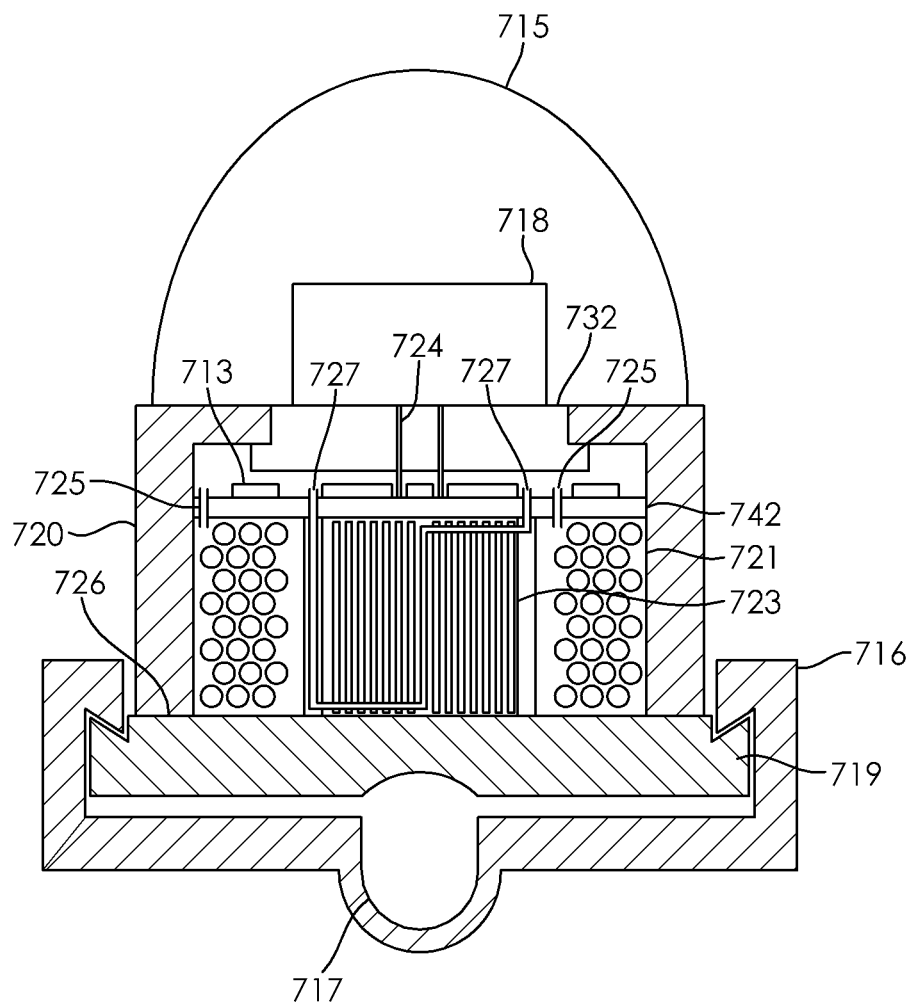
FIG. 7 depicts an illustrative cross section view of an alternative embodiment LED assembly having an LED lens covering the LED.

FIG. 7 illustrates a cross section view of another exemplary embodiment of an LED assembly having an LED lens covering the LED. An LED lens 715 may cover an LED 718. Leads 724 may pass through an opening in a heat sink 732. The assembly may also include a circuit board 742 (e.g., may include circuitry 713) that may be similar to circuit board 542. Circuit board 742 may be connected to a Graphene and cellulose insulator stack battery 723. Circuit board 742 may also be connected to a receiving coil 721 by leads 725. Lens 715 may be mounted on a housing 720 that may be bonded to a base 719 by a bond 726 (e.g., bonding material) and a mounting clip 717 including a portion 716 that may receive the LED assembly. The exemplary assembly may also include battery leads 727 that may connect Graphene and cellulose insulator stack battery 723 to circuit board 742. In at least some exemplary embodiments, stack battery 723 may be disposed with folded segments that extend substantially vertically as illustrated in FIG. 7 (e.g., as compared to folded segments of stack battery 522 that extend substantially horizontally as illustrated in FIG. 5).

Figure 8:
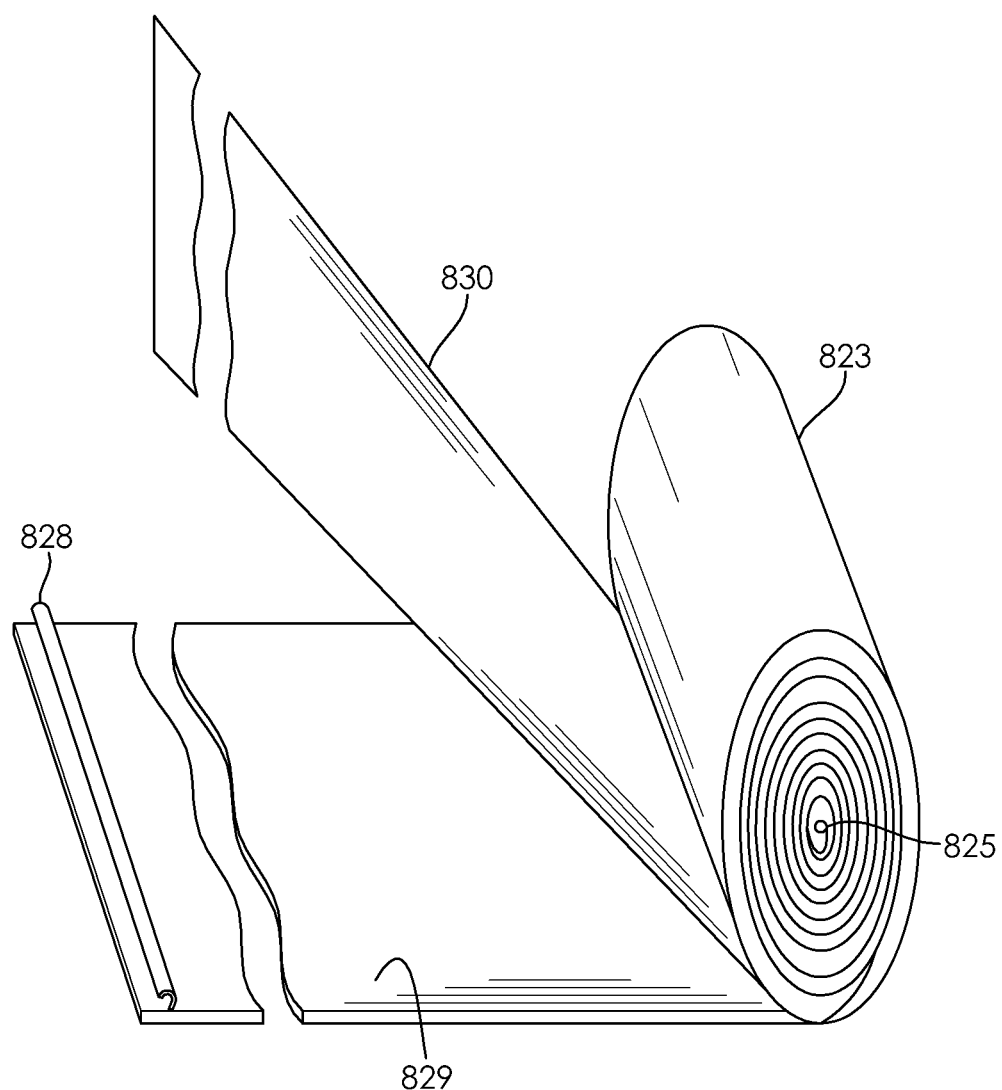
FIG. 8 depicts an embodiment method to assemble an exemplary capacitor type coil that acts as a Graphene battery.

FIGS. 8-11 illustrate exemplary methods and apparatuses for manufacturing an exemplary battery (e.g., Graphene battery) as described for example herein. FIG. 8 illustrates an exemplary method to assemble an exemplary capacitor-type coil (or capacitor coil) that may serve as a Graphene battery. For example, a capacitor-type coil may be assembled, which may form a Graphene battery 823. A one atom thick strip with an insulator 830 of similar thickness with a bonding to lead area at each end 828 (e.g., a battery electrode to lead bond) of a graphene strip 829 may be assembled. Lead 825 may come from (e.g., be connected to) a center portion of the coil.

Figure 9:
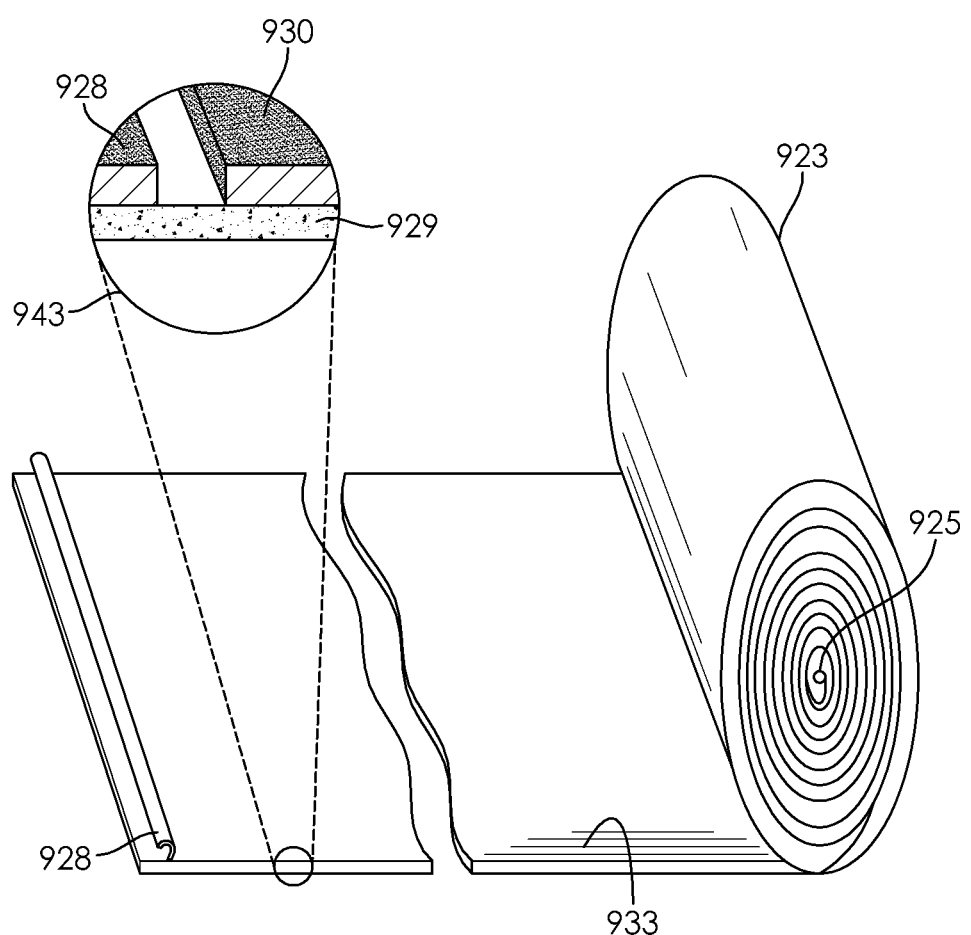
FIG. 9 depicts an alternative embodiment method to assemble an exemplary capacitor type coil that acts as a Graphene battery.

FIG. 9 illustrates another exemplary embodiment of a capacitor-type coil that may serve as a Graphene battery. FIG. 9 illustrates an exemplary method of assembling a capacitor-type coil Graphene battery 923 in which a Graphene strip 929 may be bonded with an insulation material 930 as a single strip 933. A bonded lead area 928 may be disposed at a point of fabrication (e.g., as seen in an exploded view 943 in FIG. 9). A coil lead 925 may connect to a center portion of capacitor-type coil Graphene battery 923.

Figure 10:
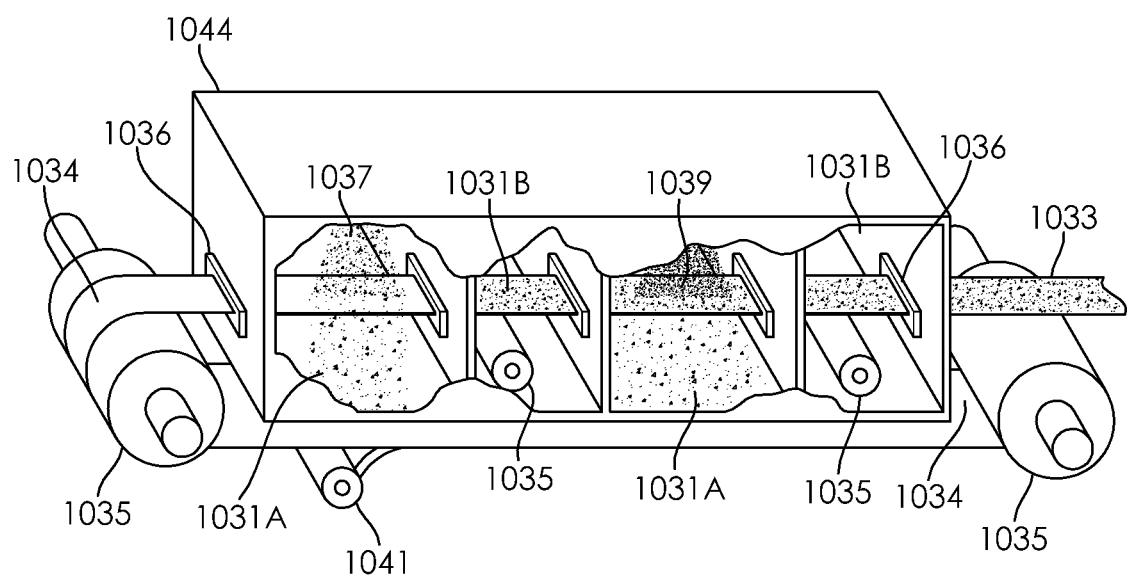
FIG. 10 depicts an exemplary method and apparatus to fabricate exemplary Graphene and insulation strips using a multicompartment vacuum chamber.

FIG. 10 illustrates an exemplary method and apparatus for fabricating at least some exemplary embodiments of Graphene and insulation strips using a multicompartment vacuum chamber. FIG. 10 illustrates an exemplary fabrication method of a Graphene and insulation strip 1033, using a multicompartment vacuum chamber 1044. A belt (e.g., continuous stainless steel substrate deposition belt 1034) may run through vacuum chamber 1044 having a plurality of vacuum seals 1036 (e.g., a vacuum seal 1036 for each compartment). Stainless steel substrate deposition belt 1034 may run over cooled or chilled rollers 1035 at each end and in cooling vacuum chambers 1031B following deposition vacuum chambers 1031A. A slurry spray 1037 may spray slurry in the first vacuum chamber 1031A. An insulation spray 1039 may spray insulation in second vacuum chamber 1031A. Stainless steel substrate deposition belt 1034 may exit multicompartment vacuum chamber 1044 through vacuum seal 1036 and may come off deposition belt 1034 as continuous Graphene/insulation strip 1033. Deposition belt 1034 may return after first being cleaned by a belt scrapper 1041 (e.g., scraper).

Figure 11:
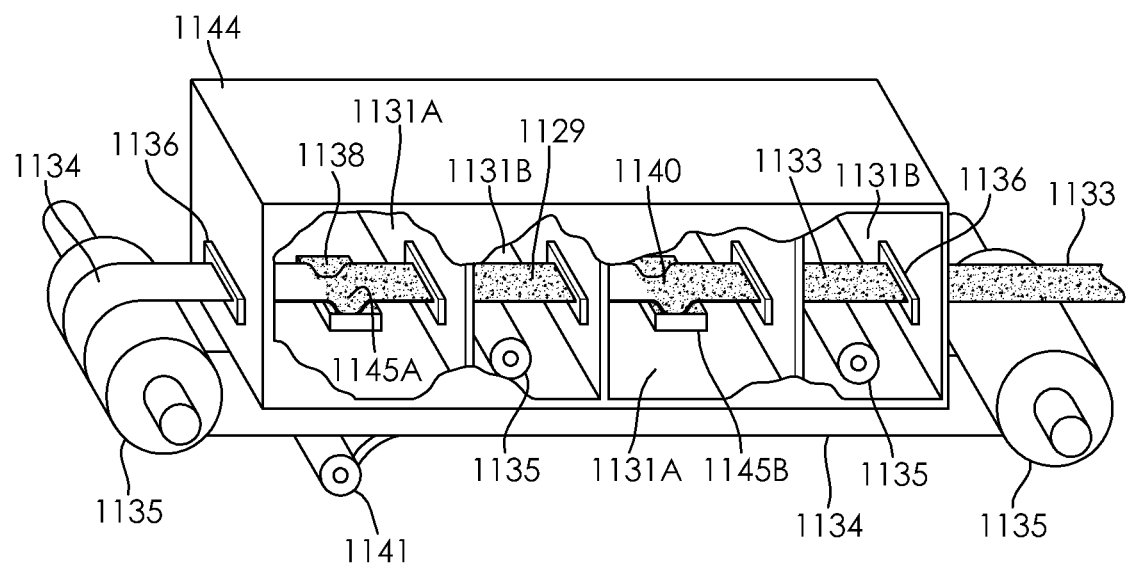
FIG. 11 depicts an alternative method and apparatus to fabricate exemplary Graphene and insulation strips using a multicompartment vacuum chamber.

FIG. 11 depicts an alternative exemplary method and apparatus for fabricating at least some exemplary embodiments of Graphene and insulation strips using a multicompartment vacuum chamber. FIG. 11 illustrates an exemplary fabrication method of a Graphene and insulation strip 1133, using a multicompartment vacuum chamber 1144. A belt (e.g., continuous stainless steel substrate deposition belt 1134) may run through vacuum chamber 1144 having a plurality of vacuum seals 1136 (e.g., a vacuum seal 1136 for each compartment). Stainless steel substrate deposition belt 1134 may run over cooled or chilled rollers 1135 at each end and in cooling vacuum chambers 1131B following deposition vacuum chambers 1131A. A slurry tank 1145A having Graphene slurry 1138 may allow for the application or deposition of slurry on Graphene strip (e.g., Graphene strip 1129) in first vacuum chamber 1131A (e.g., by passing belt 1134 through slurry tank 1145A). An insulation tank 1145B having insulation liquid 1140 may allow for the application or deposition of insulation on Graphene and insulation strip 1133 (e.g., strip 1129 may be designated as strip 1133 after deposition or application of insulation) in second vacuum chamber 1131A (e.g., by passing belt 1134 through insulation tank 1145B having insulation material). Stainless steel substrate deposition belt 1134 may exit multicompartment vacuum chamber 1144 through vacuum seal 1136 and may come off deposition belt 1134 as continuous Graphene/insulation strip 1133. Deposition belt 1134 may return after first being cleaned by a belt scrapper 1141 (e.g., scraper).

Figure 12A:
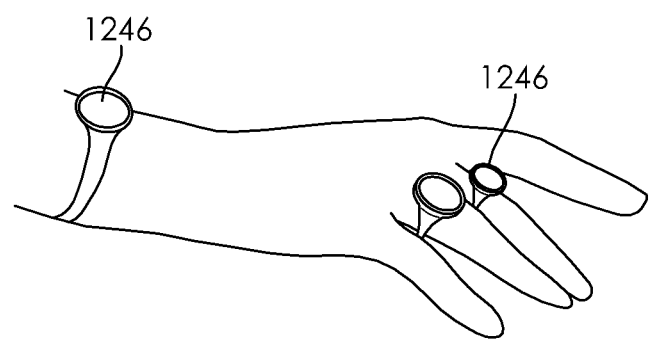
FIGS. 12A and 12B depict exemplary applications of embodiment LED assemblies.
Figure 12B:
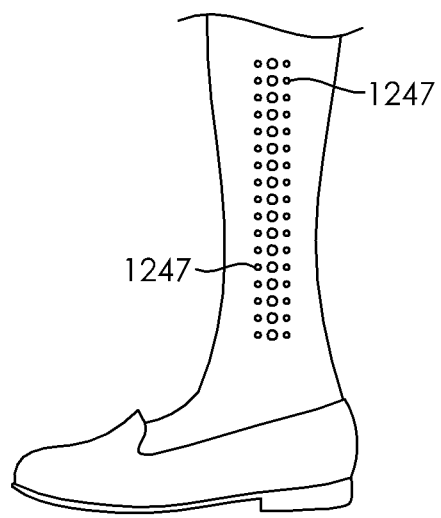

FIGS. 12A and 12B illustrate exemplary embodiments of jewelry and clothing LED assemblies. FIG. 12A illustrates a plurality of LED assemblies 1246 that may be jewelry (e.g., costume gemstones such as on rings or bracelets). FIG. 12B illustrates a plurality of LED assemblies 1247 that may also be jewelry (e.g., ornamentation disposed on clothing such as shoes, boots, pants, or stockings).

Figure 13:
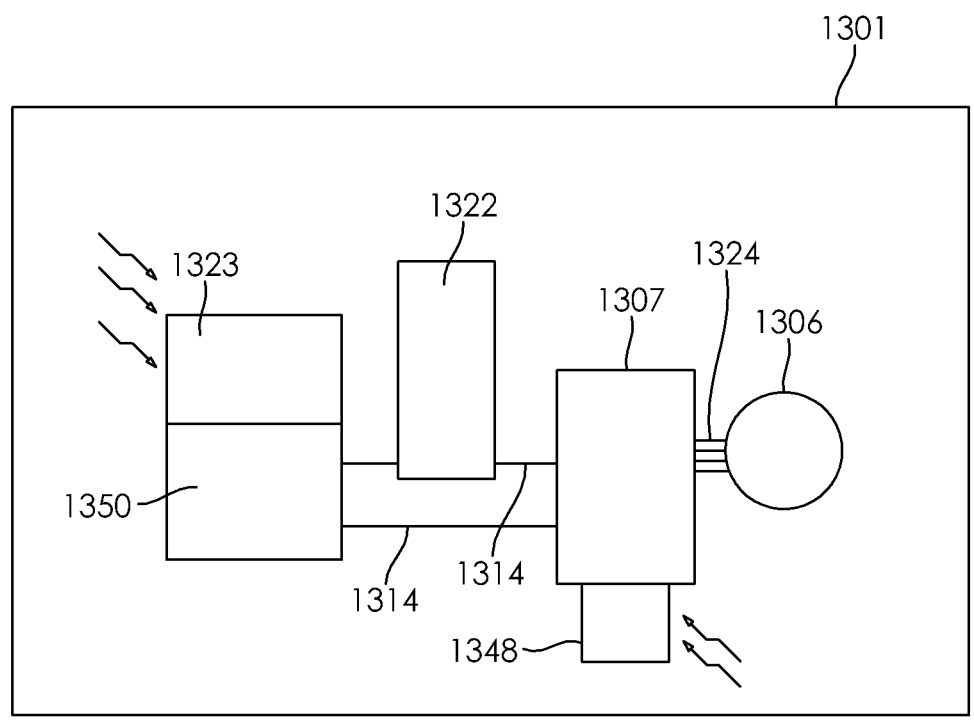
FIG. 13 depicts an exemplary harvested energy powered LED assembly remote control circuit.

FIG. 13 illustrates an exemplary embodiment of a harvested energy powered LED assembly remote control circuit. FIG. 13 illustrates a circuit block diagram within an LED assembly 1301. Power may be received wirelessly via a receiving coil 1323 from either Wi-Fi radiation (e.g., and/or radiofrequency electromagnetic radiation) from any number of Wi-Fi sources (e.g., and/or radiofrequency electromagnetic radiation sources) nearby, or purposely produced for the exemplary assembly with that energy being passed on to a tuning and converting circuitry 1350 using Energy Harvesting components. The energy may be passed to a battery 1322 and on to a controlling section 1307 (e.g., via power leads 1314), which may be controlled by (e.g., may receive its commands from) a remote control via a sensor section 1348. A signal may then be sent to an LED 1306 via LED leads 1324, which may result in the suitable illumination displays.

Figure 14:
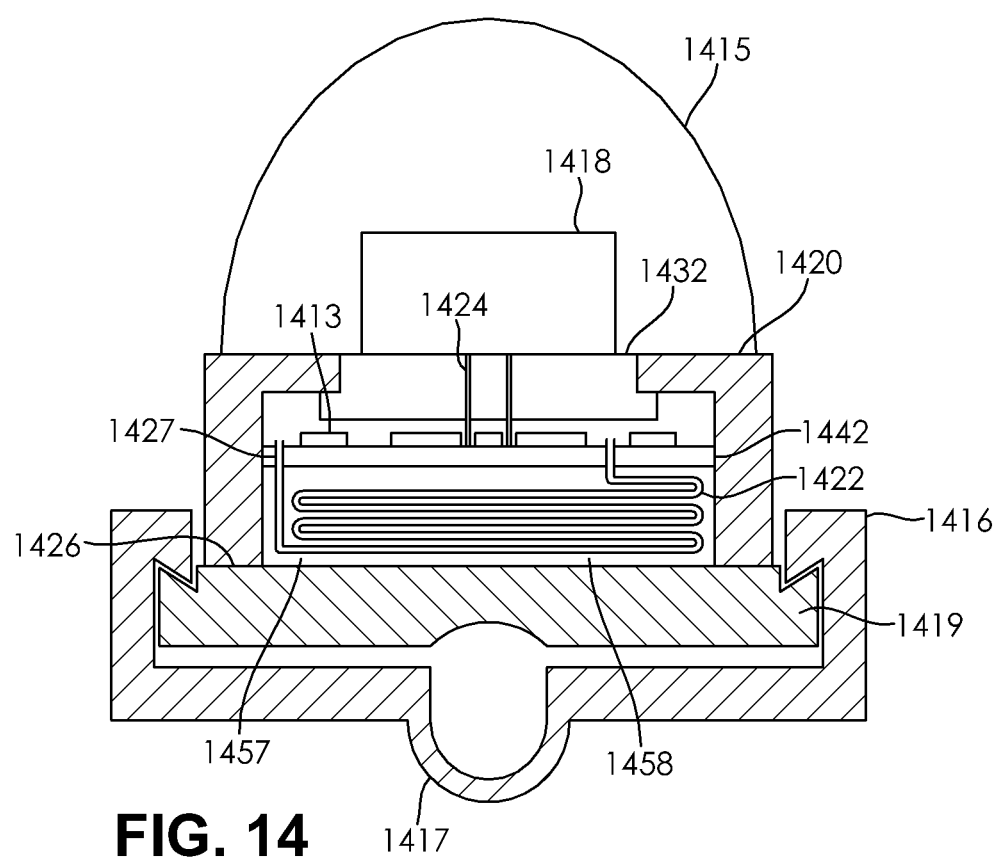
FIG. 14 depicts an additional exemplary embodiment of the present disclosure.

FIG. 14 illustrates a cross sectional view of an exemplary LED assembly having an LED lens covering an LED. An LED lens 1415 may cover an LED 1418. Leads 1424 may connect to LED 1418 through an opening in a heat sink 1432 on which LED 1418 is mounted to a circuit board 1442. Circuit board 1442 may include frequency tuning, Wi-Fi receiver components, circuitry 1413, and/or function controls. Circuit board 1442 may be connected to a Graphene and cellulose insulator stack battery 1422 (e.g., via battery leads 1427). Lens 1415 may be mounted on a housing 1420 that may be bonded to a base 1419 by a bond 1426 (e.g., bonding material) and a mounting clip 1417 including a portion 1416 that may receive the LED assembly. Stack battery 1422 may be relatively wide and thin and may include an antenna 1457 (e.g., a multi-level antenna, e.g. a fractural antenna) disposed below stack battery 1422 and surrounded by insulation 1458 (e.g., any suitable insulation material). Antenna 1457 may for example collect energy transferred by an exemplary disclosed Wi-Fi and/or RF source (e.g., as described for example herein). Stack battery 1422 and antenna 1457 may be connected to circuit board 1442 that contains circuitry 1413 to harvest the energy collected by the multifrequency receiving fractural antenna 1457 and stored in the graphene battery stack 1422 that may be used to power LED 1418 (e.g., when requested by a remote-control unit). Antenna 1457 may have a relatively small antenna design may have any suitable shape (e.g., of a plurality of pattern shapes). For example, antenna 1457 may have a shape that provides for a relatively large range of frequencies to be received simultaneously (e.g., thereby allowing a relatively large amount of weak energy signals to be harvested and stored in the graphene battery stack 1422).

Figure 15:
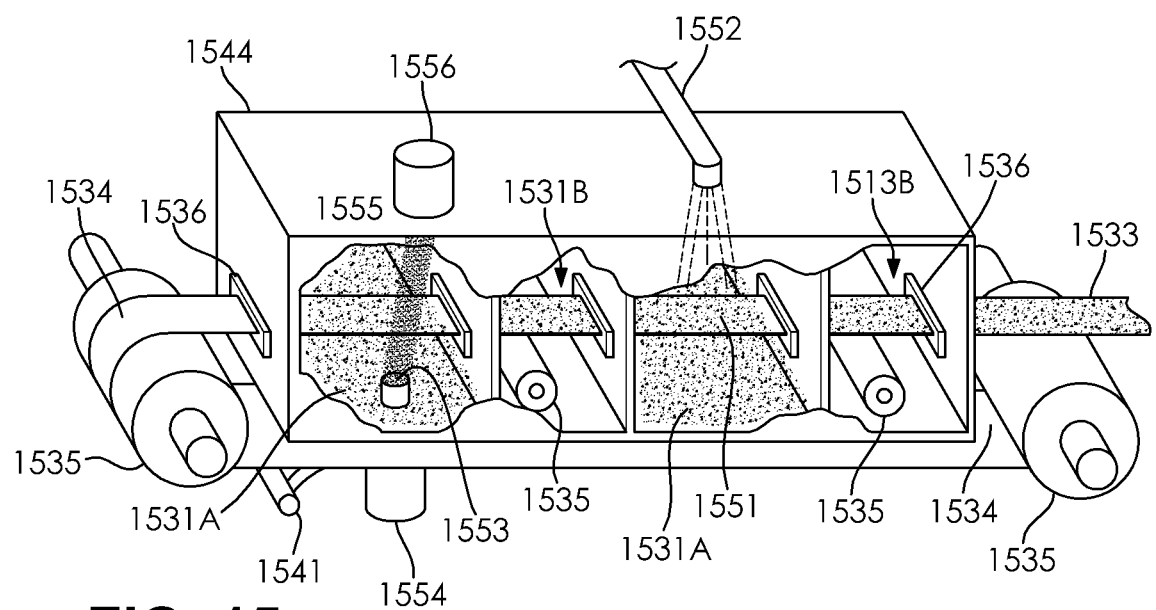
FIG. 15 depicts an additional exemplary embodiment of the present disclosure.

FIG. 15 illustrates an exemplary method and apparatus for fabricating at least some exemplary embodiments of an insulated graphene sheet. This exemplary process may use an electron beam method for vaporizing graphite in a vacuum chamber for deposition on a stainless-steel belt using a multicompartment vacuum chamber. FIG. 15 illustrates an exemplary fabrication method of a Graphene and insulation strip 1533, using a multicompartment vacuum chamber 1544. A belt (e.g., continuous stainless steel substrate deposition belt 1534) may run through vacuum chamber 1544 having a plurality of vacuum seals 1536 (e.g., a vacuum seal 1536 for each compartment). Stainless steel substrate deposition belt 1534 may run over cooled or chilled rollers 1535 at each end and in cooling vacuum chambers 1531B following for example deposition vacuum chambers 1531A. A graphite rod 1553 may be fed from below (e.g., from graphite rod feeder 1554) up into first vacuum chamber 1531A and may be vaporized by an electron beam 1555 (e.g., provided by an electron gun 1556) operating at a suitable intensity to vaporize the graphene to provide a mist for gravitational disposition. Parylene vapor 1551 (e.g., parylene vapor feed) produced by vaporization and pyrolysis equipment 1552 (e.g., including a heated vaporized feed tube) may provide insulation material (e.g., Parylene insulation material) to strip 1533 in second vacuum chamber 1531A. Stainless steel substrate deposition belt 1534 may exit multicompartment vacuum chamber 1544 through vacuum seal 1536 and may come off deposition belt 1534 as continuous Graphene/insulation strip 1533. Deposition belt 1534 may return after first being cleaned by a belt scrapper 1541 (e.g., scraper).

In at least some exemplary embodiments, the exemplary LED assemblies may have highly efficient storage capability provided in a small space, and may include micro circuitry for capture from a tuned receiving coil or Fractural antenna. The control circuitry may receive a control signal from a remote source and may command the exemplary LED assembly to illuminate a single or multi-color LEDs for specific displays.

In at least some exemplary embodiments, the exemplary disclosed manufacturing processes may provide vapor deposition for insulated graphene sheets/ribbons. In at least some exemplary embodiments, the exemplary disclosed apparatus and method may include the use of insulated graphene strips in LED assemblies.

Although various embodiments have been described with reference to the Figures, other embodiments are possible. For example, in at least some exemplary embodiments, LEDs may be used in many applications. In an illustrative example, some LEDs may be powered by rectified AC or a variety of low voltage wired sources. In various examples, LEDs may be powered by batteries that may be replaced or recharged by a wired power connection. Various embodiments may solve problems such as difficulty involved in untangling LED strings after storage, by not being connected to a wire string on part of a physically connected device. In some embodiments, exemplary LEDs may obtain their power from wireless sources on a constant basis, storing energy when they are not in use, to use when the energy is needed. Also, in some embodiments, the LEDs may be moved and/or reorganized without regard to attachment requirements.

In at least some exemplary embodiments, the exemplary disclosed apparatus may be reduced in size to provide desired battery technology. For example, the exemplary disclosed batteries may be of suitable (e.g., relatively small) size to be configured with a single LED and to provide energy to last for a reasonable time before recharging and or replacement.

In at least some exemplary embodiments, Graphene Capacitor/Batteries of suitable size (e.g., relatively small size) may be manufactured to provide adequate energy to last for a suitable or reasonable time. At least some exemplary embodiments may include a method to manufacture a Graphene battery. At least some exemplary embodiments may include manufacturing techniques for the fabrication of Graphene/insulation strips included in the exemplary disclosed capacitor/battery.

At least some exemplary embodiments may harvest energy in the air (for example, Wi-Fi- and/or RF energy) and store the harvested energy in a battery to power an individual LED. In at least some exemplary embodiments, the exemplary disclosed battery may permit increased charge storage in a relatively small (e.g., very small) battery. In at least some exemplary embodiments, the relatively smaller battery design may allow the entire LED assembly to be small. In at least some exemplary embodiments, tiny batteries including a timer may be fabricated and utilized.

In at least some exemplary embodiments, the exemplary disclosed apparatus may include a lighting component (e.g., LED 518, LED 718, and LED 1418); an energy storage assembly (e.g., battery stack 522, battery stack 622, battery stack 723, battery 823, battery 923, and stack battery 1422) electrically connected to the lighting component; a control assembly (e.g., circuit board 542, circuit board 742, and circuit board 1442) electrically connected to the energy storage assembly; and an energy receiving component (e.g., receiving coil 521, receiving coil 721, and antenna 1457) electrically connected to the control assembly. The energy receiving component may wirelessly receive energy. The energy storage assembly may include a Graphene strip. The energy storage assembly may be a Graphene stack battery and the Graphene strip may be a folded Graphene strip or a coiled Graphene strip. The Graphene strip may be a single atom Graphene strip that is folded in a stack configuration. The energy storage assembly may include the Graphene strip and an insulator strip that are folded together in a stack configuration. The insulator strip may be a cellulose strip. The lighting component may be an LED, the control assembly may be a circuit board, and the energy receiving component may be a coil. The energy receiving component may be selected from the group consisting of a coil and a multi-level antenna. The energy receiving component may be a fractural antenna. The energy storage assembly may be a capacitor coil formed from the Graphene strip, which may be a one atom thick Graphene strip, and a one atom thick insulator strip. The lighting component may be a holiday decoration LED or a costume jewelry LED.

In at least some exemplary embodiments, the exemplary disclosed method may include providing a multicompartment assembly including a first deposition vacuum chamber (e.g., chamber 1031A, chamber 1131A, and chamber 1531A), a first cooling vacuum chamber (e.g., chamber 1031B, chamber 1131B, and chamber 1531B), a second deposition vacuum chamber (e.g., chamber 1031A, chamber 1131A, and chamber 1531A), and a second cooling vacuum chamber (e.g., chamber 1031B, chamber 1131B, and chamber 1531B), passing a belt through the first deposition vacuum chamber, the first cooling vacuum chamber, the second deposition vacuum chamber, and the second cooling vacuum chamber, and depositing Graphene on the belt as the belt passes through the first deposition vacuum chamber. The exemplary disclosed method may also include cooling the deposited Graphene on the belt as the belt passes through the first cooling vacuum chamber, depositing insulation material on the cooled deposited Graphene on the belt as the belt passes through the second deposition chamber, and cooling the deposited insulation material on the cooled deposited Graphene on the belt as the belt passes through the second cooling vacuum chamber. Depositing Graphene on the belt may be selected from the group consisting of spraying slurry on the belt, passing the belt through a slurry tank, and vaporizing a graphite rod using an electron beam to provide a mist to deposit Graphene on the belt. Depositing insulation material on the cooled deposited Graphene on the belt may be selected from the group consisting of spraying insulation on the belt, passing the belt through an insulation material tank, and providing Parylene vapor to the belt. Cooling the deposited Graphene on the belt may include running the belt over cooled rotatable rollers. Cooling the deposited insulation material on the cooled deposited Graphene on the belt may include running the belt over cooled rotatable rollers. The exemplary disclosed method may also include removing the cooled insulation material deposited on the cooled Graphene from the belt that is a stainless steel belt.

In at least some exemplary embodiments, the exemplary disclosed apparatus may include a lighting assembly including an LED (e.g., LED 518, LED 718, and LED 1418), an energy storage assembly (e.g., battery stack 522, battery stack 622, battery stack 723, battery 823, battery 923, and stack battery 1422) electrically connected to the LED, a control assembly (e.g., circuit board 542, circuit board 742, and circuit board 1442) electrically connected to the energy storage assembly, and an energy receiving component (e.g., receiving coil 521, receiving coil 721, and antenna 1457) electrically connected to the control assembly; and an energy source. The energy receiving component may wirelessly receive energy from the energy source. The energy storage assembly may include a strip that is either folded or coiled. The energy source may be a Wi-Fi radiation source. The exemplary disclosed apparatus may also include a control circuit that controls the lighting assembly to selectively operate the LED. The LED may be an illuminated artificial tree light.

The exemplary disclosed apparatus and method may be used in any suitable application for harvesting energy. For example, the exemplary disclosed apparatus and method may be used in any application involving harvesting energy from sources such as Wi-Fi and/or radiofrequency sources. Also for example, the exemplary disclosed apparatus and method may be used in any application involving harvesting energy for use in a light such as an LED light.

The exemplary disclosed apparatus and method may provide an efficient and effective technique for operating a light such as an LED. For example, some exemplary embodiments may improve a user's ease of LED use. For example, this facilitation may be a result of reducing the user's effort in untangling wired LED strings after they have been stored, based on eliminating power wiring in at least some exemplary embodiments. In some exemplary embodiments, the number and type of locations or applications where LEDs may be employed may be increased. Such exemplary increased LED application potential may be a result of powering LEDs from wireless sources, and storing the energy when not in use (e.g., for use when the energy is utilized by the LED). In some exemplary embodiments, an LED operating cost may be reduced. Such reduced LED operating cost may be a result of longer lasting LED illumination powered with energy harvested from Wi-Fi or RF (e.g., radiofrequency) sources.

Some exemplary embodiments may increase protection of the natural environment. This facilitation may be a result of powering an LED with harvested ambient energy, without involving the generation of new energy in at least some exemplary embodiments. At least some exemplary embodiments may reduce the user's effort in adjusting or organizing an LED display. This facilitation may be a result of eliminating LED power wiring, which may allow a user to move and/or reorganize the LEDs without regard to attachment criteria. In at least some exemplary embodiments, the range of potential LED device design solutions may be increased. Such increased LED device design solutions may be a result of a novel Graphene battery technology having increased charge storage with reduced battery size. Various examples may provide a method to manufacture a Graphene Capacitor/Battery with reduced size that may be capable of storing adequate charge to power the LED for a useful time period.

In the Summary above and in this Detailed Description, and the claims below, and in the accompanying drawings, reference is made to particular features of various embodiments of the invention. It is to be understood that the disclosure of embodiments of the invention in this specification includes all possible combinations of such particular features. For example, where a particular feature is disclosed in the context of a particular aspect or embodiment of the invention, or a particular claim, that feature can also be used—to the extent possible—in combination with and/or in the context of other particular aspects and embodiments of the invention, and in the invention generally.

While multiple embodiments are disclosed, still other embodiments of the present invention will become apparent to those skilled in the art from this detailed description. The invention is capable of myriad modifications in various obvious aspects, all without departing from the spirit and scope of the present invention. Accordingly, the drawings and descriptions are to be regarded as illustrative in nature and not restrictive.

It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments.

In the present disclosure, various features may be described as being optional, for example, through the use of the verb "may;", or, through the use of any of the phrases: "in some embodiments," "in some implementations," "in some designs," "in various embodiments," "in various implementations,", "in various designs," "in an illustrative example," or "for example;" or, through the use of parentheses. For the sake of brevity and legibility, the present disclosure does not explicitly recite each and every permutation that may be obtained by choosing from the set of optional features. However, the present disclosure is to be interpreted as explicitly disclosing all such permutations. For example, a system described as having three optional features may be embodied in seven different ways, namely with just one of the three possible features, with any two of the three possible features or with all three of the three possible features.

In various embodiments. elements described herein as coupled or connected may have an effectual relationship realizable by a direct connection or indirectly with one or more other intervening elements.

In the present disclosure, the term "any" may be understood as designating any number of the respective elements, i.e. as designating one, at least one, at least two, each or all of the respective elements. Similarly, the term "any" may be understood as designating any collection(s) of the respective elements, i.e. as designating one or more collections of the respective elements, a collection comprising one, at least one, at least two, each or all of the respective elements. The respective collections need not comprise the same number of elements.

While various embodiments of the present invention have been disclosed and described in detail herein, it will be apparent to those skilled in the art that various changes may be made to the configuration, operation and form of the invention without departing from the spirit and scope thereof. In particular, it is noted that the respective features of embodiments of the invention, even those disclosed solely in combination with other features of embodiments of the invention, may be combined in any configuration excepting those readily apparent to the person skilled in the art as nonsensical. Likewise, use of the singular and plural is solely for the sake of illustration and is not to be interpreted as limiting.

In the present disclosure, all embodiments where "comprising" is used may have as alternatives "consisting essentially of," or "consisting of." In the present disclosure, any method or apparatus embodiment may be devoid of one or more process steps or components. In the present disclosure, embodiments employing negative limitations are expressly disclosed and considered a part of this disclosure.

Certain terminology and derivations thereof may be used in the present disclosure for convenience in reference only and will not be limiting. For example, words such as "upward," "downward," "left," and "right" would refer to directions in the drawings to which reference is made unless otherwise stated. Similarly, words such as "inward" and "outward" would refer to directions toward and away from, respectively, the geometric center of a device or area and designated parts thereof. References in the singular tense include the plural, and vice versa, unless otherwise noted.

The term "comprises" and grammatical equivalents thereof are used herein to mean that other components, ingredients, steps, among others, are optionally present. For example, an embodiment "comprising" (or "which comprises") components A, B and C can consist of (i.e., contain only) components A, B and C, or can contain not only components A, B, and C but also contain one or more other components.

Where reference is made herein to a method comprising two or more defined steps, the defined steps can be carried out in any order or simultaneously (except where the context excludes that possibility), and the method can include one or more other steps which are carried out before any of the defined steps, between two of the defined steps, or after all the defined steps (except where the context excludes that possibility).

The term "at least" followed by a number is used herein to denote the start of a range beginning with that number (which may be a range having an upper limit or no upper limit, depending on the variable being defined). For example, "at least 1" means 1 or more than 1. The term "at most" followed by a number (which may be a range having 1 or 0 as its lower limit, or a range having no lower limit, depending upon the variable being defined). For example, "at most 4" means 4 or less than 4, and "at most 40%" means 40% or less than 40%. When, in this specification, a range is given as "(a first number) to (a second number)" or "(a first number)-(a second number)," this means a range whose limit is the second number. For example, 25 to 100 mm means a range whose lower limit is 25 mm and upper limit is 100 mm.

Many suitable methods and corresponding materials to make each of the individual parts of embodiment apparatus are known in the art. According to an embodiment of the present invention, one or more of the parts may be formed by machining, 3D printing (also known as "additive" manufacturing), CNC machined parts (also known as "subtractive" manufacturing), and injection molding, as will be apparent to a person of ordinary skill in the art. Metals, wood, thermoplastic and thermosetting polymers, resins and elastomers as may be described herein-above may be used. Many suitable materials are known and available and can be selected and mixed depending on desired strength and flexibility, preferred manufacturing method and particular use, as will be apparent to a person of ordinary skill in the art.

Any element in a claim herein that does not explicitly state "means for" performing a specified function, or "step for" performing a specific function, is not to be interpreted as a "means" or "step" clause as specified in 35 U.S.C. § 112 (f). Specifically, any use of "step of" in the claims herein is not intended to invoke the provisions of 35 U.S.C. § 112 (f).

According to an embodiment of the present invention, the system and method may be accomplished through the use of one or more computing devices. One of ordinary skill in the art would appreciate that an exemplary system appropriate for use with embodiments in accordance with the present application may generally include one or more of a Central processing Unit (CPU), Random Access Memory (RAM), a storage medium (e.g., hard disk drive, solid state drive, flash memory, cloud storage), an operating system (OS), one or more application software, a display element, one or more communications means, or one or more input/output devices/means. Examples of computing devices usable with embodiments of the present invention include, but are not limited to, proprietary computing devices, personal computers, mobile computing devices, tablet PCs, mini-PCs, servers or any combination thereof. The term computing device may also describe two or more computing devices communicatively linked in a manner as to distribute and share one or more resources, such as clustered computing devices and server banks/farms. One of ordinary skill in the art would understand that any number of computing devices could be used, and embodiments of the present invention are contemplated for use with any computing device.

In various embodiments, communications means, data store(s), processor(s), or memory may interact with other components on the computing device, in order to effect the provisioning and display of various functionalities associated with the system and method detailed herein. One of ordinary skill in the art would appreciate that there are numerous configurations that could be utilized with embodiments of the present invention, and embodiments of the present invention are contemplated for use with any appropriate configuration.

According to an embodiment of the present invention, the communications means of the system may be, for instance, any means for communicating data over one or more networks or to one or more peripheral devices attached to the system. Appropriate communications means may include, but are not limited to, circuitry and control systems for providing wireless connections, wired connections, cellular connections, data port connections, Bluetooth connections, or any combination thereof. One of ordinary skill in the art would appreciate that there are numerous communications means that may be utilized with embodiments of the present invention, and embodiments of the present invention are contemplated for use with any communications means.

Throughout this disclosure and elsewhere, block diagrams and flowchart illustrations depict methods, apparatuses (i.e., systems), and computer program products. Each element of the block diagrams and flowchart illustrations, as well as each respective combination of elements in the block diagrams and flowchart illustrations, illustrates a function of the methods, apparatuses, and computer program products. Any and all such functions ("disclosed functions") can be implemented by computer program instructions; by special-purpose, hardware-based computer systems; by combinations of special purpose hardware and computer instructions; by combinations of general purpose hardware and computer instructions; and so on—any and all of which may be generally referred to herein as a "circuit," "module," or "system."

While the foregoing drawings and description may set forth functional aspects of the disclosed systems, no particular arrangement of software for implementing these functional aspects should be inferred from these descriptions unless explicitly stated or otherwise clear from the context.

Each element in flowchart illustrations may depict a step, or group of steps, of a computer-implemented method. Further, each step may contain one or more sub-steps. For the purpose of illustration, these steps (as well as any and all other steps identified and described above) are presented in order. It will be understood that an embodiment can contain an alternate order of the steps adapted to a particular application of a technique disclosed herein. All such variations and modifications are intended to fall within the scope of this disclosure. The depiction and description of steps in any particular order is not intended to exclude embodiments having the steps in a different order, unless required by a particular application, explicitly stated, or otherwise clear from the context.

Traditionally, a computer program consists of a sequence of computational instructions or program instructions. It will be appreciated that a programmable apparatus (i.e., computing device) can receive such a computer program and, by processing the computational instructions thereof, produce a further technical effect.

A programmable apparatus may include one or more microprocessors, microcontrollers, embedded microcontrollers, programmable digital signal processors, programmable devices, programmable gate arrays, programmable array logic, memory devices, application specific integrated circuits, or the like, which can be suitably employed or configured to process computer program instructions, execute computer logic, store computer data, and so on. Throughout this disclosure and elsewhere a computer can include any and all suitable combinations of at least one general purpose computer, special-purpose computer, programmable data processing apparatus, processor, processor architecture, and so on.

It will be understood that a computer can include a computer-readable storage medium and that this medium may be internal or external, removable and replaceable, or fixed. It will also be understood that a computer can include a Basic Input/Output System (BIOS), firmware, an operating system, a database, or the like that can include, interface with, or support the software and hardware described herein.

Embodiments of the system as described herein are not limited to applications involving conventional computer programs or programmable apparatuses that run them. It is contemplated, for example, that embodiments of the invention as claimed herein could include an optical computer, quantum computer, analog computer, or the like.

Regardless of the type of computer program or computer involved, a computer program can be loaded onto a computer to produce a particular machine that can perform any and all of the disclosed functions. This particular machine provides a means for carrying out any and all of the disclosed functions.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

In some embodiments, computer program instructions may be stored in a computer-readable memory capable of directing a computer or other programmable data processing apparatus to function in a particular manner. The instructions stored in the computer-readable memory constitute an article of manufacture including computer-readable instructions configured to implement any and all of the disclosed functions.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

The elements depicted in flowchart illustrations and block diagrams throughout the figures imply logical boundaries between the elements. However, according to software or hardware engineering practices, the disclosed elements and the functions thereof may be implemented as parts of a monolithic software structure, as standalone software modules, or as modules that employ external routines, code, services, and so forth, or any combination of these. All such implementations are within the scope of the present disclosure.

Unless explicitly stated or otherwise clear from the context, the verbs "execute" and "process" are used interchangeably to indicate execute, process, interpret, compile, assemble, link, load, any and all combinations of the foregoing, or the like. Therefore, embodiments that execute or process computer program instructions, computer-executable code, or the like can suitably act upon the instructions or code in any and all of the ways just described.

The functions and operations presented herein are not inherently related to any particular computer or other apparatus. Various general-purpose systems may also be used with programs in accordance with the teachings herein, or it may prove convenient to construct more specialized apparatus to perform the required method steps. The required structure for a variety of these systems will be apparent to those of skill in the art, along with equivalent variations. In addition, embodiments of the invention are not described with reference to any particular programming language. It is appreciated that a variety of programming languages may be used to implement the present teachings as described herein, and any references to specific languages are provided for disclosure of enablement and best mode of embodiments of the invention. Embodiments of the invention are well suited to a wide variety of computer network systems over numerous topologies. Within this field, the configuration and management of large networks include storage devices and computers that are communicatively coupled to dissimilar computers and storage devices over a network, such as the Internet.

A number of implementations have been described. Nevertheless, it will be understood that various modifications may be made. For example, advantageous results may be achieved if the steps of the disclosed techniques were performed in a different sequence, or if components of the disclosed systems were combined in a different manner, or if the components were supplemented with other components. Accordingly, other implementations are contemplated within the scope of the following claims.

What is claimed is:

1. An apparatus, comprising:
   a lighting component;
   an energy storage assembly electrically connected to the lighting component;
   a control assembly electrically connected to the energy storage assembly;
   an energy receiving component electrically connected to the control assembly; and
   a housing;
   wherein the energy receiving component wirelessly receives energy;
   wherein the received energy is transferred to the energy storage assembly and powers the lighting component;
   wherein the energy storage assembly is a Graphene battery that includes a Graphene strip;
   wherein each of the energy storage assembly, the control assembly, and the energy receiving component is disposed in the housing;
   wherein the lighting component is disposed on the housing; and wherein the energy storage assembly that is disposed in the housing is a Graphene stack battery; and wherein the Graphene strip is a folded Graphene strip with a folded serpentine shape having intervening insulation strips disposed between a plurality of folded Graphene strip portions with leads at the two ends of the Graphene strip.

2. The apparatus of claim 1, wherein the Graphene strip is a single atom Graphene strip and the insulator strip is a cellulose strip.

3. The apparatus of claim 1, wherein:
   the energy storage assembly includes the Graphene strip and an insulator strip that are folded together in a stack configuration that is disposed in the housing, the stack configuration being attached via electrical leads to the lighting component; and
   the received energy powers the lighting component based on being transferred from the stack configuration disposed in the housing to the lighting component disposed on the housing via the electrical leads.

4. The apparatus of claim 1, further comprising a mounting clip, wherein:
   the lighting component is an LED, the control assembly is a circuit board, and the energy receiving component is a coil;
   the housing includes a base portion disposed on an opposite side of the housing than the LED; and
   the base portion is configured to be received in a cavity of the mounting clip.

5. The apparatus of claim 1, wherein the energy receiving component is selected from the group consisting of a coil and a multi-level antenna.

6. The apparatus of claim 1, wherein the energy receiving component is a fractal antenna.

7. The apparatus of claim 1, wherein the energy storage assembly is a capacitor coil formed from the Graphene strip, which is a one atom thick Graphene strip.

8. The apparatus of claim 1, wherein the lighting component is a holiday decoration LED or a costume jewelry LED.

9. The apparatus of claim 1, further comprising:
   a base portion disposed on an opposite side of the housing to the lighting component; and
   a mounting clip;
   wherein the base portion is removably attachable to the mounting clip; and
   wherein the base portion and the mounting clip form an aperture when the base portion is removably attached to the mounting clip.

10. An apparatus, comprising:
    a lighting assembly including
       a housing;
       an LED disposed on the housing,
       an energy storage assembly disposed in the housing and electrically connected to the LED,
       a control assembly disposed in the housing and electrically connected to the energy storage assembly, and
       an energy receiving component disposed in the housing and electrically connected to the control assembly;
    an energy source; and
    a clip assembly that is attachable to a holiday decoration or to clothing;
    wherein the energy receiving component wirelessly receives energy from the energy source;
    wherein the received energy is transferred from the energy receiving component to the energy storage assembly;
    wherein the energy storage assembly powers the LED with the received energy;
    wherein the energy storage assembly is a Graphene battery that includes a Graphene strip;
    wherein the lighting assembly is removably attachable to the clip assembly; and wherein the Graphene strip is a folded Graphene strip with a folded serpentine shape having intervening insulation strips disposed between a plurality of folded Graphene strip portions with leads at the two ends of the Graphene strip.

11. The apparatus of claim 10, wherein:
    the energy source is a Wi-Fi radiation source and the energy is captured from Wi-Fi radiation; and
    the lighting assembly includes a base portion that is removably attachable to the clip assembly, the base portion and the clip assembly configured to attach to an artificial tree branch when the base portion is attached to the clip assembly.

12. The apparatus of claim 10, further comprising a control circuit that controls the lighting assembly to selectively operate the LED.

13. The apparatus of claim 10, wherein:
the LED is an illuminated artificial tree light; and
the clip assembly is sized so that it is removably attachable to an artificial Christmas tree.

* * * * *